(12) United States Patent
Cheng et al.

(10) Patent No.: US 7,768,315 B2
(45) Date of Patent: Aug. 3, 2010

(54) MULTIPLEXOR WITH LEAKAGE POWER REGULATOR

(75) Inventors: Zhibin Cheng, Cary, NC (US); Robert G. Gerowitz, Raleigh, NC (US); Claudia M. Tartevet, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 87 days.

(21) Appl. No.: 11/863,643

(22) Filed: Sep. 28, 2007

(65) Prior Publication Data

US 2009/0085609 A1    Apr. 2, 2009

(51) Int. Cl.
*H03K 19/20*    (2006.01)
(52) U.S. Cl. .................. 326/104; 326/113; 326/121; 326/122
(58) Field of Classification Search ............. 326/93–98, 326/104–108, 112, 119, 121
See application file for complete search history.

(56) References Cited

U.S. PATENT DOCUMENTS

| | | | | |
|---|---|---|---|---|
| 4,225,849 | A | * | 9/1980 | Lai .................. 340/146.2 |
| 6,222,380 | B1 | * | 4/2001 | Gerowitz et al. ........... 326/38 |
| 2005/0083082 | A1 | * | 4/2005 | Olofsson .................. 326/95 |
| 2006/0026457 | A1 | * | 2/2006 | Bernstein et al. ........... 714/6 |
| 2006/0101315 | A1 | | 5/2006 | Dhong et al. |

OTHER PUBLICATIONS

Balabanian, Norman, Digital Logic Design Principles, 2007, Wiley-India, pp. 46-48.*

* cited by examiner

*Primary Examiner*—Rexford N Barnie
*Assistant Examiner*—Jany Tran
(74) *Attorney, Agent, or Firm*—Joscelyn G. Cockburn; Mark E. McBurney; Thomas E. Tyson

(57) ABSTRACT

A circuit for a multiplexer includes a pair of NAND gates with outputs coupled to an OAI gate constructed from a complementary circuit formed from solid state devices. A current flow controller formed from solid state devices is coupled to one of the NAND gates. When activated the controller inhibits the flow of current through the NAND gate and a portion of the OAI gate to which the controller is connected. As a consequence, leakage power is not consumed within the multiplexer. Several of the applications in which the circuit is used are also demonstrated in the specification.

8 Claims, 7 Drawing Sheets

MULTIPLEXOR WITH LEAKAGE POWER REGULATOR

CROSS REFERENCE TO RELATED PATENT APPLICATION

The present application relates to application Ser. No. 11/620,137 filed Jan. 5, 2007, and assigned to the assignee of the present application. The referenced application is herein incorporated in its entirety in the present application.

BACKGROUND OF THE INVENTION

1. Technical Field

The present invention relates to electronic components in general and in particular to multiplexer (hereafter MUX).

2. Description of Related Art

The development and design of functional electrical circuits such as programmable logic array (PLA), application specific integrated circuits (ASICs) etc. are based upon electrical components sometimes called basic building blocks. Among the many building blocks that are used regularly is the MUX. A conventional MUX has at least two inputs, one output and a control terminal. Each of the inputs is associated with a separate and distinct path through the MUX. In this type of MUX the paths are activated sequentially. Stated another way, at any instance of time only one path and associated input is activated while the other input remains inactive. As a consequence, the results on the single output are due to activities on only one of the inputs.

Even though this type of MUX works well for its intended purposes it has one drawback which could limit its use in several types of combinatorial logic design. The drawback is that the prior art MUX generated leakage power resulting in unnecessary heating. The leakage power generation is primarily due to current flow in transistors that are not fully turned off. These partially turned on transistors are in the non-activated path of the MUX. The leakage power drawback will get worse as the geometries of circuits shrink and more MUX are used in a particular design.

Due to the complexity of ASICs design tests methodologies are required to make sure the design functions the way it is suppose to work. There are two methodologies used for testing. One methodology is called Level Sensitive Scan Design (LSSD) and the other is called MUX'ed scan design. One of the applications in which the MUX can be used is the MUX'ed scan design. Other applications that the inventors of the present invention deemed novel are set forth herein after.

FIG. 1a shows a high level diagram for a two to one (2 to 1) MUX consisting of three NAND gates labeled 100, 102 and 104. A capacitive load labeled cload and an output labeled out are connected to NAND gate 104. A data line labeled d1 and a control line labeled sel are connected to NAND gate 100. Similar line labeled d2 and selb are connected to NAND gate 102.

FIG. 1b shows a mixed schematic of high level and circuit level components for a 2 to 1 MUX. For simplicity items and/or components that are identical in FIGS. 1a and 1b are identified by common alphanumeric characters. The circuit level components for NAND gate 104 consist of two PMOS devices 106 and 108 connected in parallel. The source electrodes of devices 106 and 108 are coupled to the positive rail of power supply Vdd. The base electrode of device 106 is connected to d1_sel and the base electrode of NMOS device 112. The source electrode of device 112 is connected to the Ground (Gnd) rail of the power supply. The output from NAND gate 102 is labeled int and is connected to the base electrode of device 108 and 110. The parallel configuration of NMOS devices 106 and 108 is connected to the series configuration of NMOS devices 110 and 112 and output terminal labeled out.

Still referring to FIGS. 1a and 1b this type of latch has two independent transmission paths. One path includes NAND gate 100 and NAND gate 104 responding to signals d1 and sel whereas the other path consisting of NAND gates 102 and 104 respond to signals d2 and sel_b. In some designs the path consisting of NAND gates 102 and 104 can be used as a scan path to test operability of the design. In particular, NAND gate 102 receiving d2 scan in signal becomes useless after the completion of the scan test and dissipates power due to leakage current.

In view of the above, there is a need to provide a MUX that does not consume useless power due to leakage current or other phenomenon.

SUMMARY OF THE INVENTION

A MUX includes a pair of NAND gates one of which is coupled by a pair of switching devices to the positive and ground (Gnd) rails of a power supply. The outputs from the pair of NAND gates are coupled to the respective rails of the power supply by an OAI (OR-AND-INVERTER) logic gate. The gate electrodes of each of the switching devices are connected to control signals (powergate), which cause the signal path associated with the straddled NAND gate to be isolated or cut off from the power supply. By doing so, the path through the MUX via the non-straddled NAND gate can be used as a signal path.

The MUX according to the present invention can be used in a MUX'ed scan design. During testing the path with power gated devices are used as the scan path. When the designer is satisfied with the design that path is disconnected from the power supply and the path without power gated devices is available for use. By cutting off current from the power supply to the NAND gate no leakage power is dissipated in the test path.

In addition to its use in LSSD and MUX'ed scan design, the MUX of the present invention can be used in other circuit configuration including bypassing memory and JTAG logic. Usage in both applications will be described herein after.

The above as well as other objectives, features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrated embodiment when read in conjunction with the accompanying drawings, wherein.

DETAILED DESCRIPTION OF AN ILLUSTRATIVE EMBODIMENT

Figure 1A:
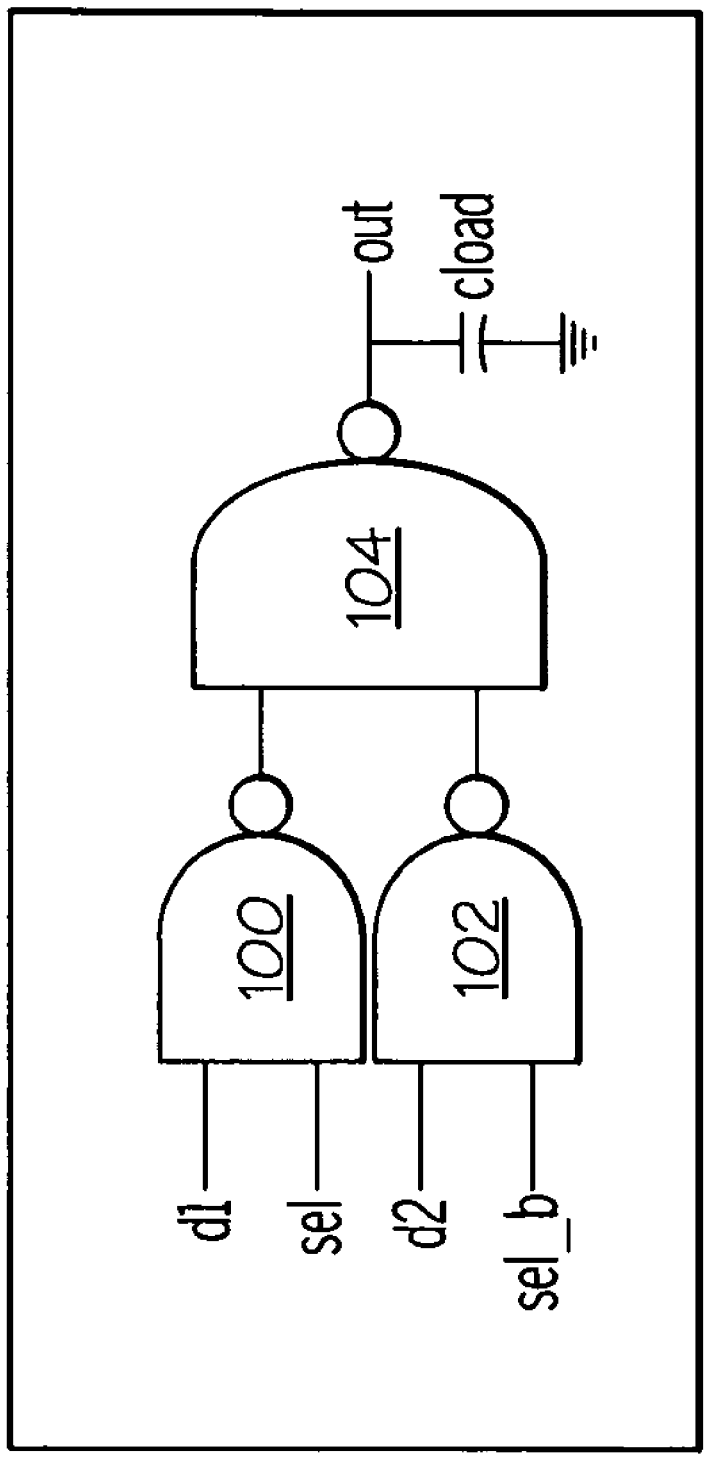
FIGS. 1a and 1b show a MUX with no power consumption controller.
Figure 1B:
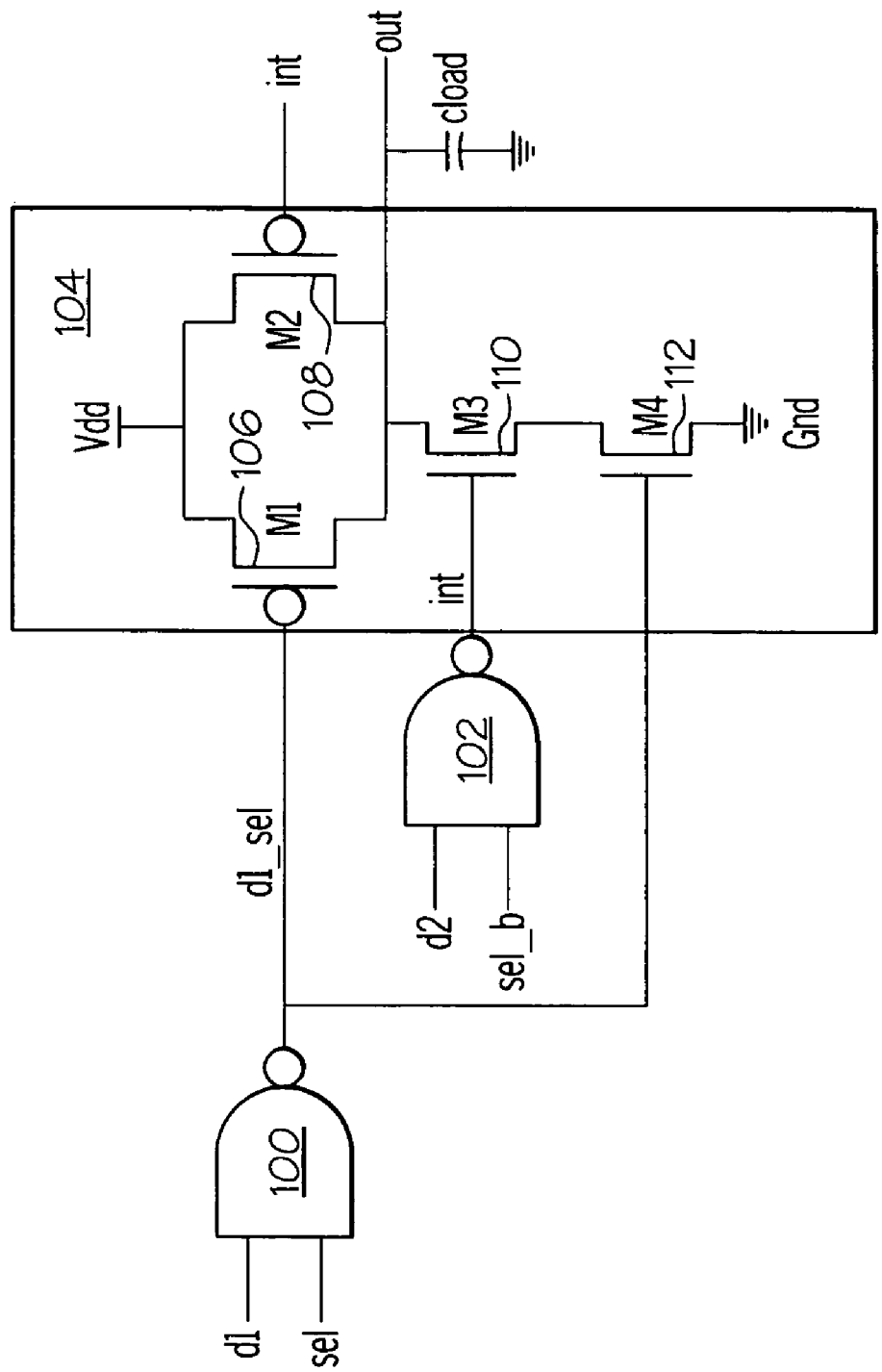
Figure 2A:
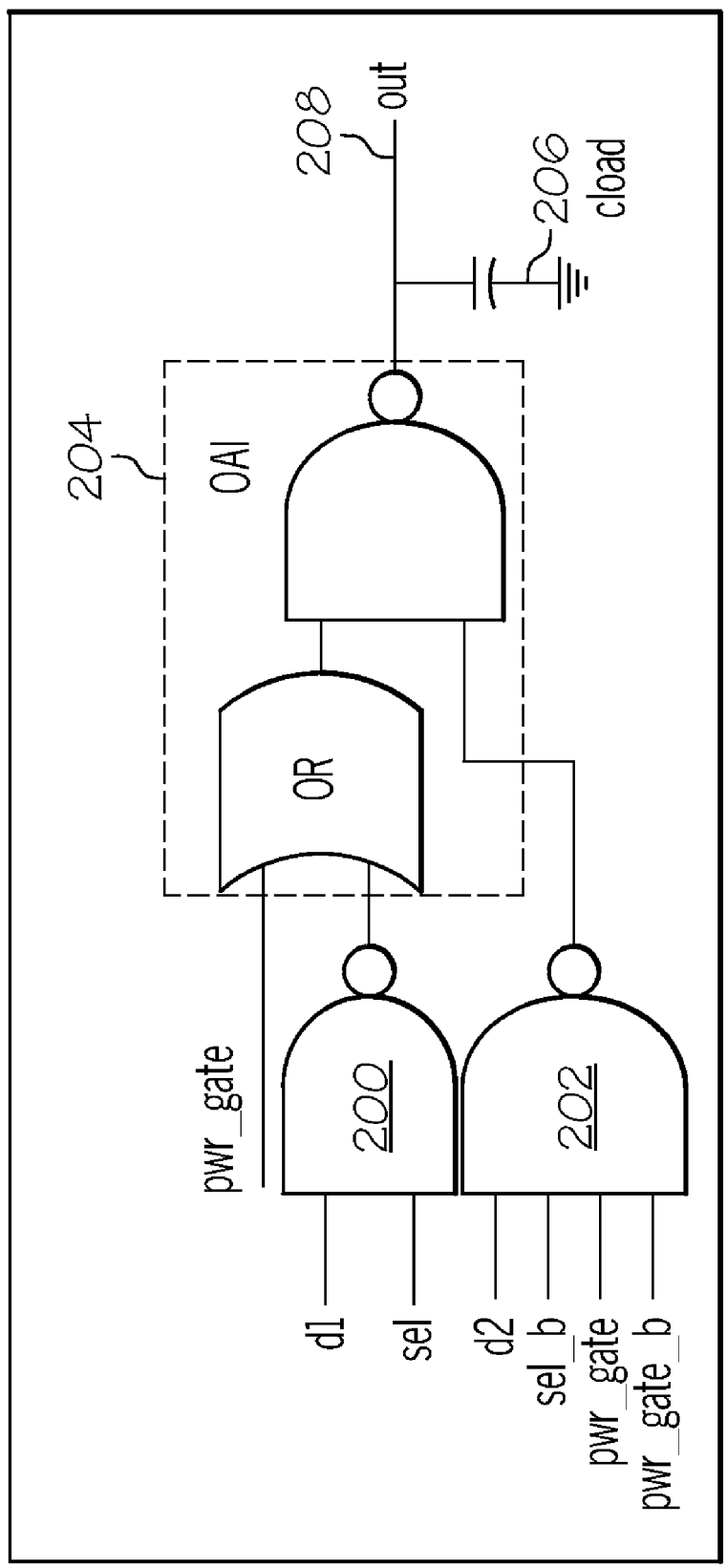
FIGS. 2a and 2b show a MUX with power consumption controller according to teachings of the present invention.

FIG. 2a shows a high level diagram of the MUX, according to teachings of the present invention, which includes a pair of NAND gates 200, 202 and OR-AND-INVERTER (OAI) gate 204 connected to capacitor (cload) 206 and output (out) terminal 208.

Figure 2B:
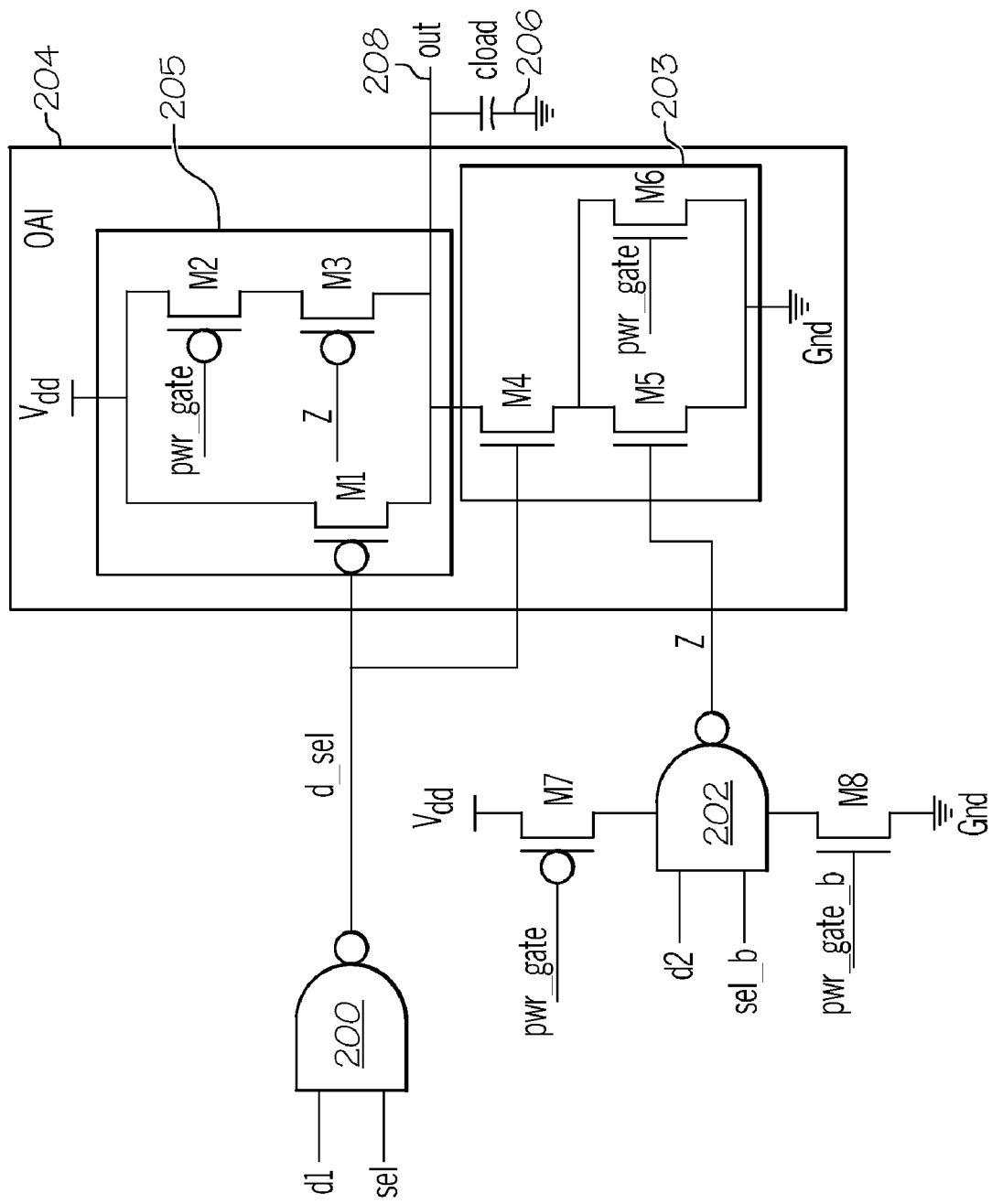

Still referring to FIG. 2b, the OAI system 204 output node out 208, OAI gate 203 formed by NMOS devices M4, M5 and M6. Devices M5 and M6 are connected in parallel and M4 is connected in series with the parallel pair. The base electrode of M4 is connected to the output, d_sel, of NAND gate 200. The gate electrode of M5 is connected to the conductor labeled z which is the output of NAND gate 202. The control signal, labeled pwr_gate is connected to the base electrode of M6. A complementary circuit of PMOS devices M1, M2 and M3 couples out 208 and OAI gate 205 to the positive rail of the power supply. The base electrode of M1 is connected to the output of NAND gate 200. The control line labeled pwr_gate is connected to the base of M2. The output labeled z from NAND gate 202 is connected to the base of M3.

The MUX circuit of the present invention operates as follows:

In power gating mode when the signal pwr_gate is high, the power supply is removed from the power gated NAND gate 202, which produces an undefined value on signal z as depicted. Because z is ORed and ANDed by pwr_gate signal in the OAI gates 203 and 205 the undefined output from NAND gate 202 is overridden by signal pwr_gate at transistors M6 and M2. When either d1 or sel is low, d_sel is high, which turns on M4 and turns off M1, and if pwr_gate is high, M6 is also turned on, so the output 208 is low. When d1 and sel are both high, then d_sel is low, which turns on M1, while M2, M3 and M4 are off, so the output 208 is high. Therefore, d1 is selected in both cases. In non-power gating mode pwr_gate is low. In this case, two power gating transistors M7, M8 are on, so the scan-in signal d2 can be selected and go freely to the output pin. Logically, with M2, M6 on and z is defined, the OAI gate is reduced to an NAND gate. During a scan additional impedance is applied to the MUX because M2 and M6 are in the circuit.

Figure 3:
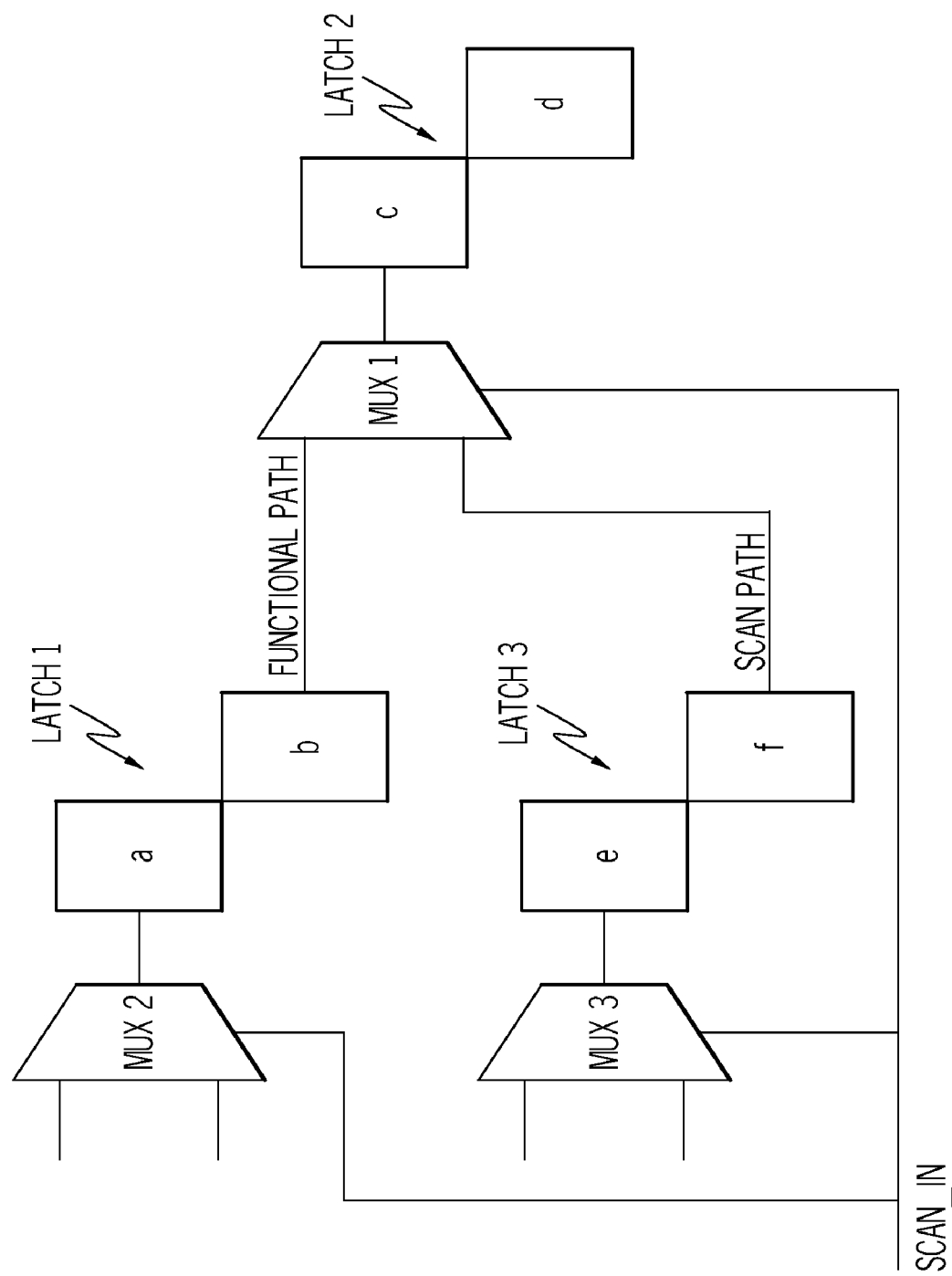
FIG. 3 shows a portion of an ASIC embodying the MUX of the present invention.

FIG. 3 shows a diagram of a partial ASIC using the MUX of the present invention in a MUX'ed scan design. The ASIC includes MUX 1 operatively coupled to latches 1, 2 and 3. Each of the latches includes sub-latch pairs labeled a and b, c and d. The functional operation of this circuit requires the output of latch 1 to feed latch 2. The scan path used during manufacturing test requires the output of latch 3 to feed latch2, and half of MUX 1, which can be turned off in functional mode and the circuits associated with that half of the MUX should not leak.

Figure 4:
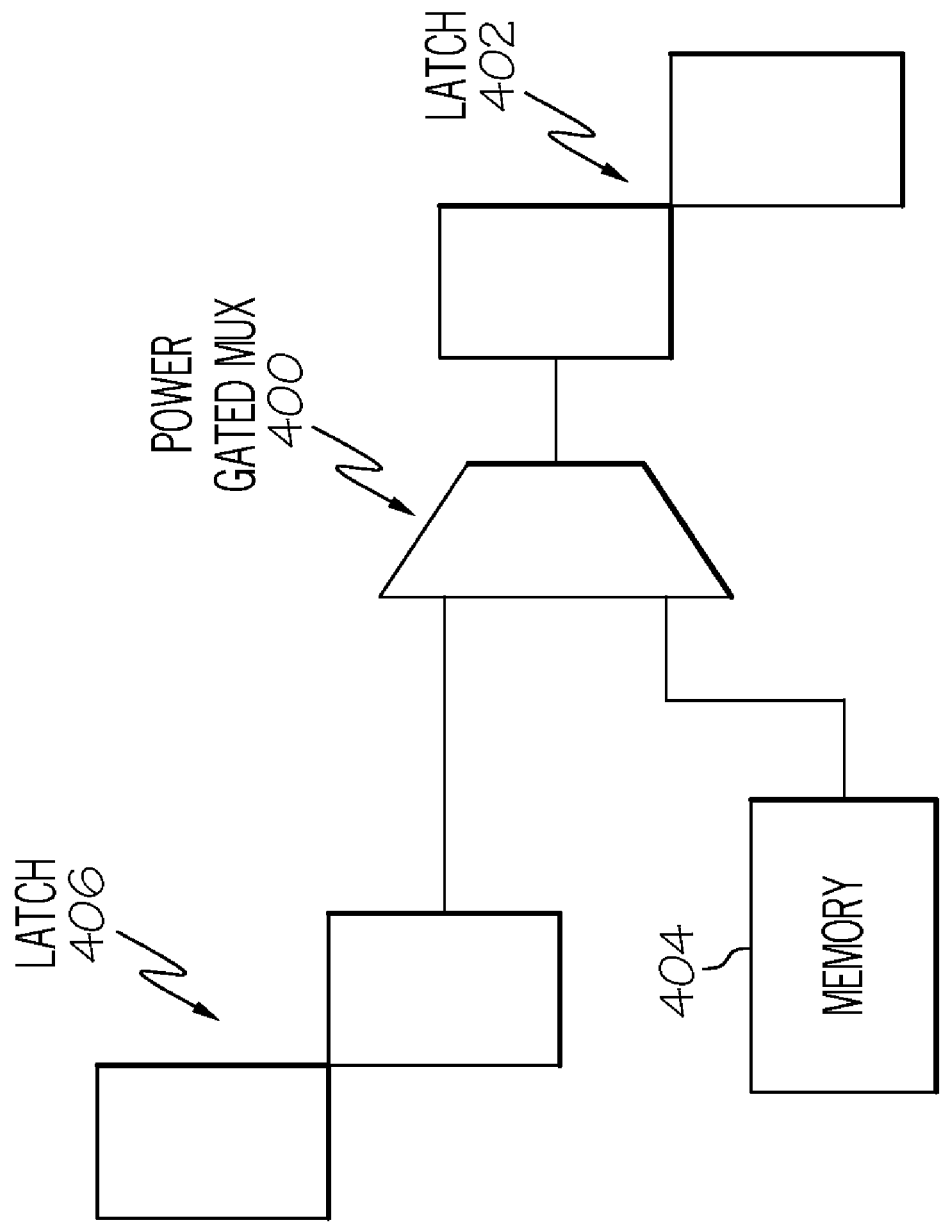
FIG. 4 shows a configuration using the MUX of the present invention to bypass memory.

FIG. 4 shows a diagram of a configuration in which power gated MUX 400 of the present invention has an output connected to latch 402, one input connected to memory 404 and another input connected to latch 406. Each latch includes sub-latch pairs. This configuration could be used in a manufacturing test path used to bypass an embedded memory 404.

Figure 5:
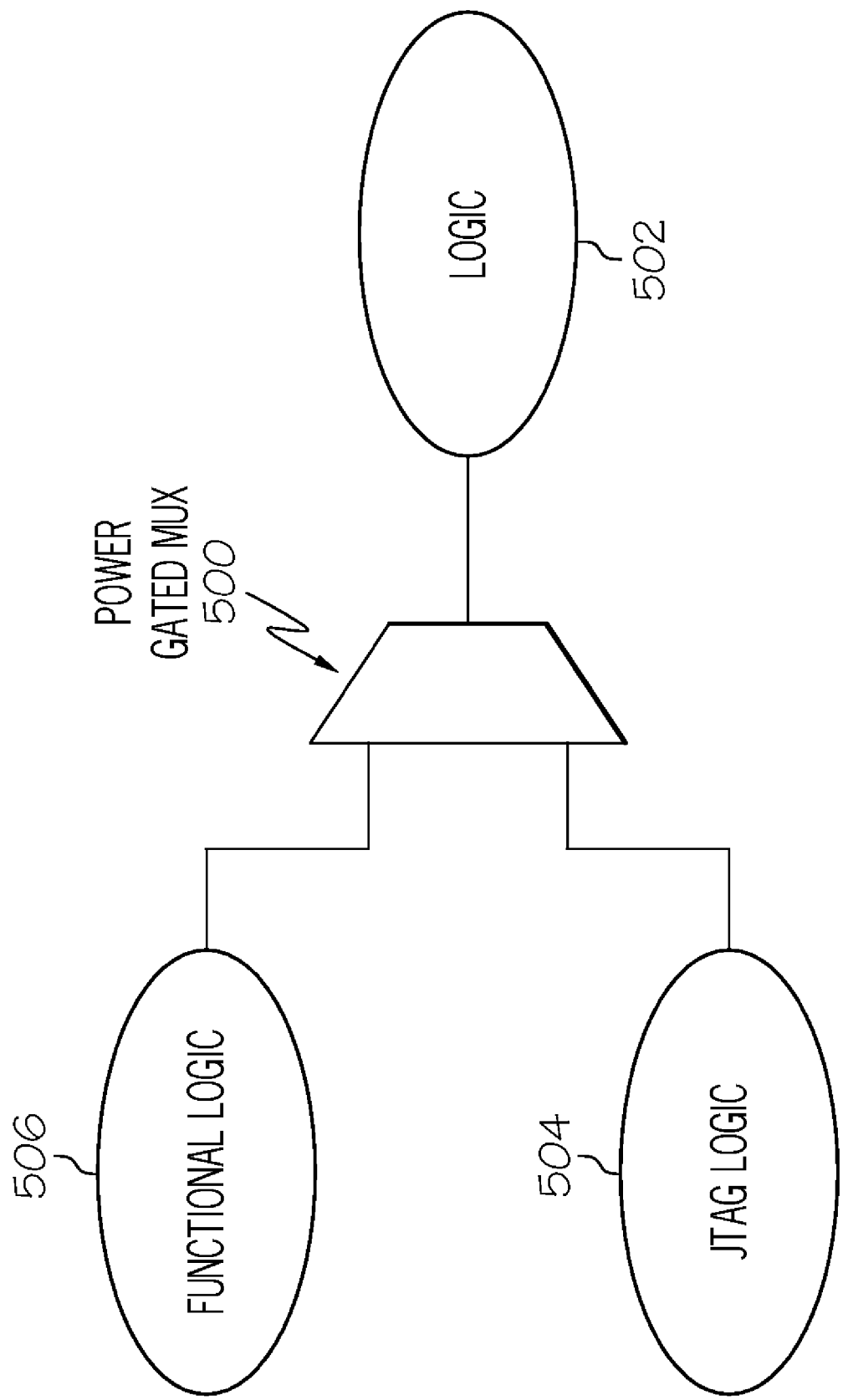
FIG. 5 shows a configuration using the MUX of the present invention in JTAG logic configuration.

FIG. 5 shows yet another configuration in which the Power Gated MUX 500 of the present invention is coupled to logic 502, 504 and 506. The JTAG Logic 504 is promulgated by IEEE 1149 Joint Test Access Group (JTAG). The JTAG path is rarely used and could be cut off when not in use by the Power Gated MUX 500.

While the invention has been particularly shown and described with reference to an embodiment, it will be understood by those skilled in the art that various changes in form and details may be made therein without departing from spirit and scope of the present invention.

What is claimed is:

1. A multiplexer circuit comprising:
   a first NAND gate connecting a first multiplexer input;
   a second NAND gate connecting a second multiplexer input;
   a switching system operatively coupled to said second NAND gate and operable to toggle on or off a power supply to said second NAND gate via an input signal; and
   an OR-AND-INVERTER (OAI) circuit arrangement operatively coupled to said switching system and to outputs from said first and said second NAND gates and providing a multiplexer output to a multiplexer output node wherein the OAI circuit including an OR gate operatively coupled to said switching system and an AND gate operatively coupled to said switching system.

2. The multiplexer circuit of claim 1 further comprising a storage device operatively coupled to said multiplexer output node.

3. The multiplexer circuit of claim 2, wherein said storage device comprises a capacitor.

4. The multiplexer circuit of claim 1, wherein said switching system comprises a PMOS device for operatively coupling said second NAND gate to a positive power rail of said power supply.

5. The multiplexer circuit of claim 4, wherein said switching system further comprises a NMOS device for operatively coupling said second NAND gate to a ground (GND) power rail of said power supply.

6. The multiplexer circuit of claim 1 wherein said OAI circuit arrangement comprises:
   an OAI gate operatively coupled to said multiplexer output node; and
   a complementary circuit of PMOS devices operatively coupled to said multiplexer output node.

7. The multiplexer circuit of claim 1 further comprising:
   a first level sensitive scan design latch operatively coupled to an input of said first NAND gate;
   a memory having an output operatively coupled to an input of said second NAND gate; and
   a second level sensitive scan design latch operatively coupled to said multiplexer output node.

8. The circuit of multiplexer claim 1 further comprising:
   a module operatively coupled to an input of said second NAND gate;
   a first functional logic operatively coupled to an input of said first NAND gate; and
   a second functional logic module operatively coupled to said multiplexer output node.

* * * * *